(12) United States Patent
Miura et al.

(10) Patent No.: US 9,640,718 B2
(45) Date of Patent: May 2, 2017

(54) METHOD FOR MANUFACTURING DISPLAY ELEMENT, DISPLAY ELEMENT, AND DISPLAY DEVICE

(71) Applicant: Kabushiki Kaisha Toshiba, Minato-ku (JP)

(72) Inventors: Kentaro Miura, Kanagawa-ken (JP); Tatsunori Sakano, Kanagawa-ken (JP); Tomomasa Ueda, Kanagawa-ken (JP); Nobuyoshi Saito, Tokyo (JP); Shintaro Nakano, Kanagawa-ken (JP); Yuya Maeda, Kanagawa-ken (JP); Hajime Yamaguchi, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 232 days.

(21) Appl. No.: 14/171,947

(22) Filed: Feb. 4, 2014

(65) Prior Publication Data
US 2014/0246685 A1  Sep. 4, 2014

(30) Foreign Application Priority Data
Mar. 4, 2013 (JP) .................................. 2013-042249

(51) Int. Cl.
*H01L 21/00* (2006.01)
*H01L 33/08* (2010.01)
(Continued)

(52) U.S. Cl.
CPC ............ *H01L 33/08* (2013.01); *H01L 51/003* (2013.01); *H01L 27/3246* (2013.01);
(Continued)

(58) Field of Classification Search
CPC .............. H01L 27/1266; H01L 51/003; H01L 51/0097; H01L 51/5237; H01L 51/5253;
(Continued)

(56) References Cited

U.S. PATENT DOCUMENTS

| 5,888,839 A * | 3/1999 | Ino ..................... H01L 29/66757 257/E21.134 |
| 2001/0015787 A1* | 8/2001 | Sakuwa ............ G02F 1/133305 349/158 |

(Continued)

FOREIGN PATENT DOCUMENTS

| JP | 2007-27525 A | 2/2007 |
| JP | 2008-268713 | 11/2008 |

(Continued)

OTHER PUBLICATIONS

Office Action issued Jan. 13, 2016 in Chinese Patent Application No. 201410074883.0 (with English translation and English translation of category of cited documents).

(Continued)

*Primary Examiner* — Jerome Jackson, Jr.
*Assistant Examiner* — John Lin
(74) *Attorney, Agent, or Firm* — Oblon, McClelland, Maier & Neustadt, L.L.P.

(57) ABSTRACT

According to one embodiment, a method for manufacturing a display element is disclosed. The method can include forming a peeling layer, forming a resin layer, forming a barrier layer, forming an interconnect layer, forming a display layer, and removing. The peeling layer is formed on a major surface of a base body. The major surface has first, second, and third regions. The peeling layer includes first, second, and third peeling portions. The resin layer is formed on the peeling layer. The resin layer includes first and second resin portions. The barrier layer is formed on the first, second, and third peeling portions. The interconnect layer is formed on the barrier layer. The display layer is formed on the interconnect layer. The first peeling portion is removed from the first resin portion and the second peeling portion is removed from the second resin portion.

15 Claims, 10 Drawing Sheets

(51) Int. Cl.
  *H01L 51/00* (2006.01)
  *H01L 51/52* (2006.01)
  *H01L 51/56* (2006.01)
  *H01L 27/32* (2006.01)

(52) U.S. Cl.
  CPC .......... *H01L 51/5253* (2013.01); *H01L 51/56* (2013.01); *H01L 2251/566* (2013.01)

(58) Field of Classification Search
  CPC .. H01L 51/5338; H01L 51/56; H01L 51/0024
  USPC .............................................. 438/22, 33, 34
  See application file for complete search history.

(56) References Cited

U.S. PATENT DOCUMENTS

| | | | |
|---|---|---|---|
| 2003/0230750 A1* | 12/2003 | Koyama | H01L 29/78696 257/72 |
| 2004/0099926 A1* | 5/2004 | Yamazaki | G02F 1/1362 257/632 |
| 2004/0256618 A1* | 12/2004 | Imai | H01L 27/1214 257/59 |
| 2007/0096079 A1 | 5/2007 | Nakayama et al. | |
| 2010/0289020 A1* | 11/2010 | Yano | H01L 29/78603 257/43 |
| 2011/0092006 A1* | 4/2011 | An | B29D 11/0073 438/29 |

FOREIGN PATENT DOCUMENTS

| | | |
|---|---|---|
| JP | 2011-23376 | 2/2011 |
| JP | 2011-243583 | 12/2011 |
| TW | 406382 B | 9/2000 |
| WO | WO 2009/063583 A1 | 5/2009 |

OTHER PUBLICATIONS

Combined Taiwanese Office Action and Search Report issued Jan. 7, 2016 in Patent Application No. 103104407 (with English translation).

* cited by examiner

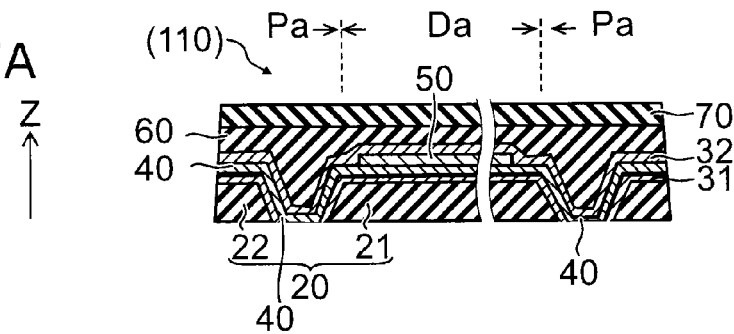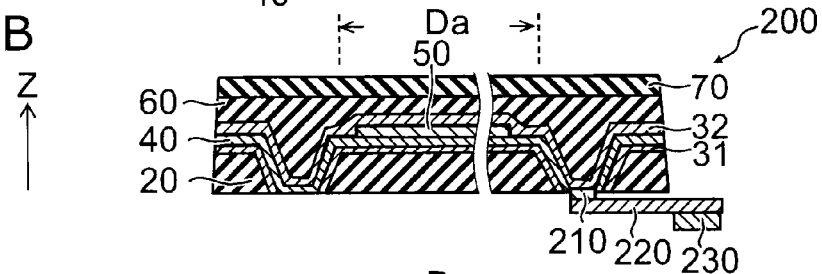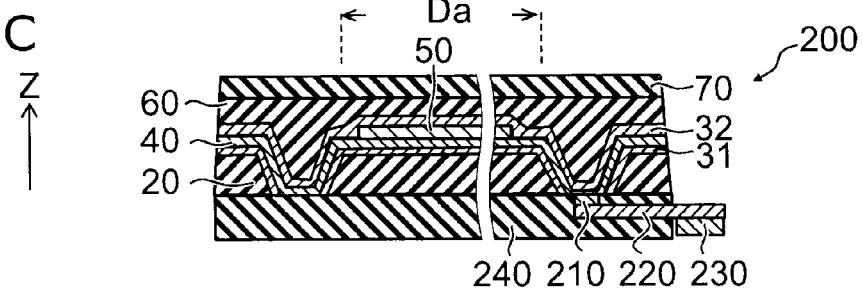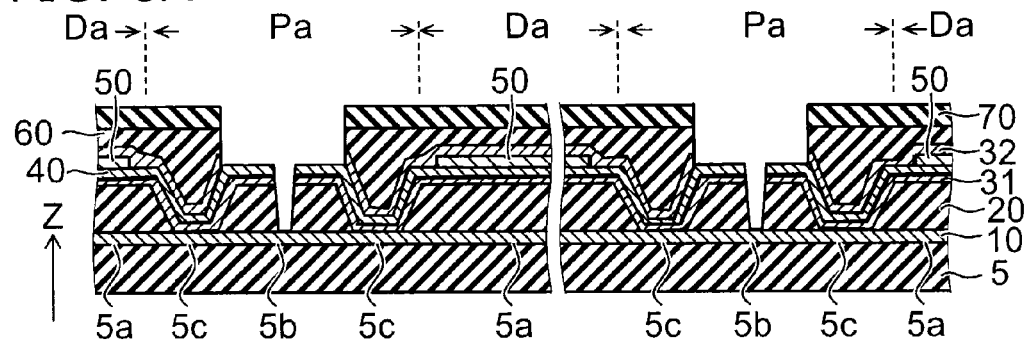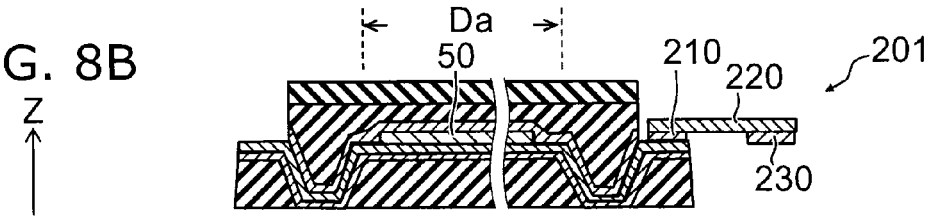

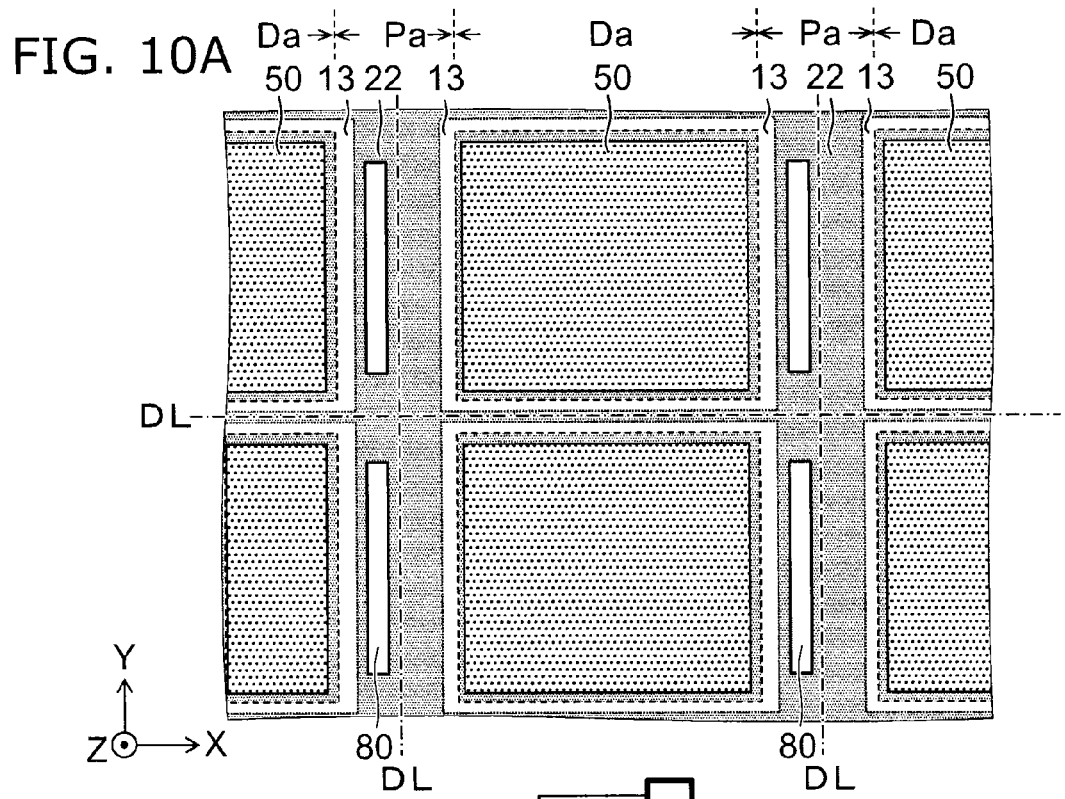

US 9,640,718 B2

METHOD FOR MANUFACTURING DISPLAY ELEMENT, DISPLAY ELEMENT, AND DISPLAY DEVICE

CROSS-REFERENCE TO RELATED APPLICATIONS

This application is based upon and claims the benefit of priority from Japanese Patent Application No. 2013-042249, filed on Mar. 4, 2013; the entire contents of which are incorporated herein by reference.

FIELD

Embodiments described herein relate generally to a method for manufacturing a display element, a display element, and a display device.

BACKGROUND

The need for flexible sheet-type display elements is increasing with the rapid spread of mobile devices. It is desirable to increase the reliability of such display elements.

BRIEF DESCRIPTION OF THE DRAWINGS

FIG. 7A to FIG. 7C are schematic cross-sectional views in order of the processes, showing a display device and a method for manufacturing the display device according to a second embodiment;

FIG. 8A and FIG. 8B are schematic cross-sectional views in order of the processes, showing another display device and a method for manufacturing the display device according to the second embodiment;

FIG. 10A to FIG. 10D are schematic views showing another display device according to the second embodiment.

DETAILED DESCRIPTION

Figure 1A:
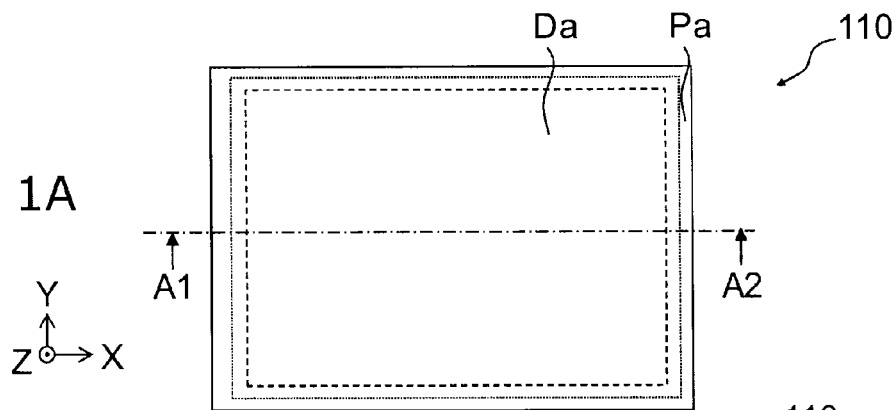
FIG. 1A to FIG. 1C are schematic views showing a display element according to a first embodiment.

According to one embodiment, a method for manufacturing a display element is disclosed. The method can include forming a peeling layer, forming a resin layer, forming a barrier layer, forming an interconnect layer, forming a display layer, and removing. The peeling layer having a first linear coefficient of thermal expansion is formed on a major surface of a base body. The major surface has a first region, a second region provided around the first region, and a third region provided between the first region and the second region. The first region corresponds to a display region of the display element. The peeling layer includes a first peeling portion positioned on the first region, a second peeling portion positioned on the second region, and a third peeling portion positioned on the third region. The resin layer having a first water permeability and a second linear coefficient of thermal expansion different from the first linear coefficient of thermal expansion is formed on the peeling layer. The resin layer includes a first resin portion positioned on the first peeling portion and a second resin portion positioned on the second peeling portion. The barrier layer having a second water permeability lower than the first water permeability is formed on the first resin portion, the second resin portion, and the third peeling portion. The interconnect layer is formed on the barrier layer. The display layer is formed on at least a portion of the interconnect layer on the first resin portion. The first peeling portion is removed from the first resin portion and the second peeling portion is removed from the second resin portion.

According to one embodiment, a display element is manufactured by a method for manufacturing the display element. The method can include forming a peeling layer having a first linear coefficient of thermal expansion on a major surface of a base body, the major surface having a first region, a second region provided around the first region, and a third region provided between the first region and the second region, the first region corresponding to a display region of the display element, the peeling layer including a first peeling portion positioned on the first region, a second peeling portion positioned on the second region, and a third peeling portion positioned on the third region. The method can include forming a resin layer having a first water permeability and a second linear coefficient of thermal expansion different from the first linear coefficient of thermal expansion on the peeling layer, the resin layer including a first resin portion positioned on the first peeling portion and a second resin portion positioned on the second peeling portion. The method can include forming a barrier layer having a second water permeability lower than the first water permeability on the first resin portion, the second resin portion, and the third peeling portion, forming an interconnect layer on the barrier layer, and forming a display layer on at least a portion of the interconnect layer on the first resin portion. In addition the method can include removing the first peeling portion from the first resin portion and removing the second peeling portion from the second resin portion.

According to one embodiment, a display element includes a resin layer having a first water permeability, a barrier layer provided on the resin layer and having a second water permeability lower than the first water permeability, a display layer provided on the barrier layer, a circuit substrate separated from the display layer in a second direction intersecting a first direction from the resin layer toward the display layer, a first protective layer provided on the circuit substrate and having a third water permeability lower than the first water permeability, and an interconnect layer including a first portion provided between the barrier layer and the display layer and a second portion provided between the circuit substrate and the first protective layer, the second portion overlapping the resin layer when projected onto a plane perpendicular to the second direction.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
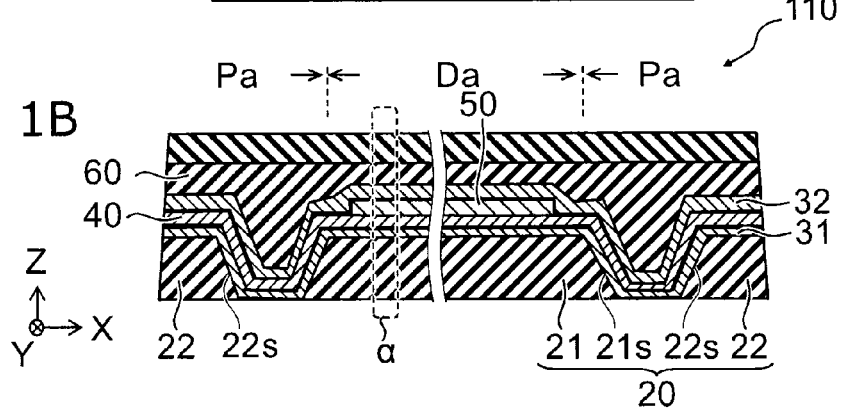
Figure 1C:
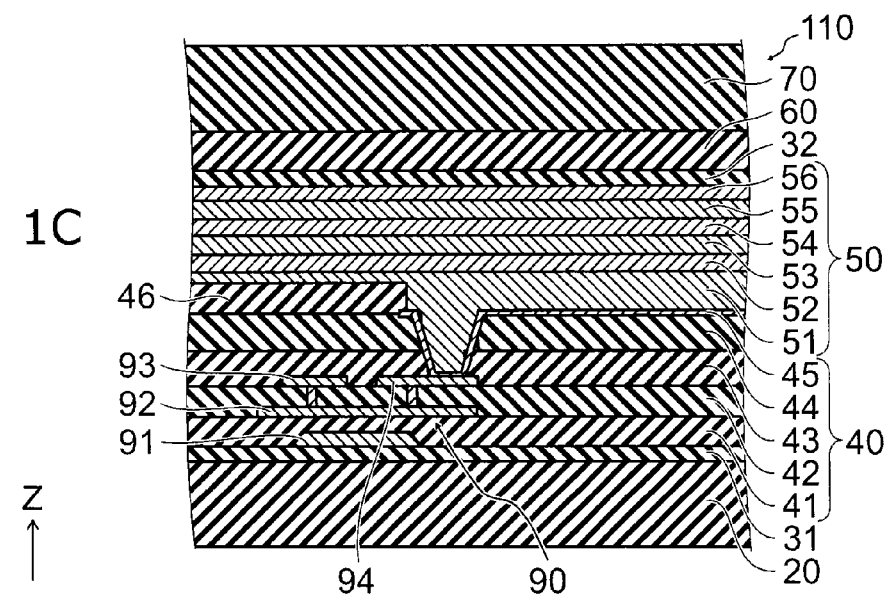

FIG. 1A to FIG. 1C are schematic views showing a display element according to a first embodiment. FIG. 1A is a schematic plan view of the display element 110. FIG. 1B is a cross-sectional view along line A1-A2 of FIG. 1A. FIG. 1C is an enlarged view of a portion of FIG. 1B.

As shown in FIG. 1A, the display element 110 has a display region Da and a peripheral region Pa. A display is performed in the display region Da. The peripheral region Pa is provided around the display region Da.

As shown in FIG. 1B, the display element 110 includes a resin layer 20, a barrier layer 31, an interconnect layer 40, a display layer 50, and a first protective layer 32. The barrier layer 31 is provided on the resin layer 20. The interconnect layer 40 is provided on the barrier layer 31. The display layer 50 is provided on a portion of the interconnect layer 40. The first protective layer 32 is provided on the display layer 50 and a portion of the interconnect layer 40.

In the specification of the application, the state of being "provided on" includes not only the state of being provided in direct contact but also the state in which another layer is inserted therebetween.

A direction from the resin layer 20 toward the display layer 50 is taken as a stacking direction (a Z-axis direction). One direction orthogonal to the Z-axis direction is taken as an X-axis direction. A direction orthogonal to the Z-axis direction and the X-axis direction is taken as a Y-axis direction.

The resin layer 20 includes a first resin portion 21 and a second resin portion 22. The first resin portion 21 overlaps the display region Da when projected onto a plane perpendicular to the stacking direction. The second resin portion 22 is provided at a position corresponding to a portion of the peripheral region Pa.

It is favorable for the resin layer 20 to have, for example, heat resistance, chemical resistance, and dimensional stability. The resin layer 20 includes, for example, a polyimide resin. The resin layer 20 may include, for example, acrylic, aramid, epoxy, a cyclic polyolefin, or a liquid crystal polymer. The resin layer 20 may include a high heat resistance resin. For example, at least one selected from a paraxylene resin, a fluoric resin, polyethersulphone (PES), polyethylene naphthalate (PEN), and polyetheretherketone (PEEK) may be used as the high heat resistance resin.

For example, in the case where the display element 110 has a structure in which light is extracted from the resin layer 20 side, it is favorable for the resin layer 20 to be transparent in the visible light region. In such a case, the resin layer 20 includes, for example, a transparent polyimide resin or a transparent aramid resin.

The barrier layer 31 is provided on the first resin portion 21 and the second resin portion 22. The barrier layer 31 covers a first side surface 21s of the first resin portion 21. In the example, the barrier layer 31 also covers a second side surface 22s of the second resin portion 22. The barrier layer 31 also is provided, for example, between the first resin portion 21 and the second resin portion 22.

The water permeability (a second water permeability) of the barrier layer 31 is lower than the water permeability (a first water permeability) of the resin layer 20. The barrier layer 31 has, for example, an oxygen permeability that is lower than that of the resin layer 20. The barrier layer 31 includes an inorganic material. For example, at least one selected from a silicon nitride film ($SiN_x$), a silicon oxynitride film ($SiO_xN_y$), a silicon oxide film ($SiO_x$), and an aluminum oxide film ($AlO_x$) is used as the inorganic material.

The barrier layer 31 may include, for example, a stacked film of an inorganic film and an organic resin film. Thereby, stress is relaxed; and the occurrence of cracks is suppressed. The organic resin film includes, for example, polyimide, acrylic, a paraxylene resin, etc. In the case where a stacked film is used as the barrier layer 31, it is favorable for an inorganic material such as a silicon oxide film ($SiO_x$), an aluminum oxide film ($AlO_x$), etc., to be used as the uppermost layer of the barrier layer 31.

The display layer 50 is provided on a portion of the first resin portion 21. The display layer 50 includes, for example, an organic light emitting layer. The display layer 50 may include, for example, a layer that has an emission of light and/or a change of an optical characteristic including at least one selected from transmittance, reflectance, scattering rate, absorptance, and refractive index occurring according to at least one selected from a voltage and a current supplied via the interconnect layer 40. The display layer 50 emits, for example, light for the display. The display layer 50 may perform switching of the light. For example, the display layer 50 may modulate the light.

The first protective layer 32 includes, for example, an inorganic material. The inorganic material includes, for example, at least one selected from a silicon nitride film ($SiN_x$), a silicon oxynitride film ($SiO_xN_y$), a silicon oxide film ($SiO_x$), and an aluminum oxide film ($AlO_x$). The first protective layer 32 may include the same material as the barrier layer 31; or a different material may be used. The water permeability (a third water permeability) of the first protective layer 32 is, for example, lower than the water permeability (the first water permeability) of the resin layer 20.

In the display element 110 as shown in FIG. 1B, the resin layer 20 (the first resin portion 21) and the display layer 50 are provided in the display region Da. There are cases where the resin layer 20 cannot sufficiently suppress the penetration of moisture and/or oxygen. In the display element 110, for example, the penetration of moisture and/or oxygen from the first side surface 21s into the first resin portion 21 can be suppressed because the first side surface 21s of the first resin portion 21 is covered with the barrier layer 31. Accordingly, high reliability of the display element 110 is obtained because the penetration of moisture and/or oxygen into the interconnect layer 40 and/or the display layer 50 is suppressed.

In the example, the display element 110 further includes a bonding layer 60 and a support body 70.

The bonding layer 60 is provided between the support body 70 and the first protective layer 32. In the example, the support body 70 is bonded to the first protective layer 32 by the bonding layer 60.

The bonding layer 60 includes, for example, a pressure sensitive material, a thermoset material, an ultraviolet-curing material, etc. It is favorable for the bonding layer 60 to include a material having low water permeability. The bonding layer 60 includes, for example, an epoxy resin or an acrylic resin. In the case where the bonding layer 60 includes the thermoset material, it is desirable to cure at a temperature of about 100° C. Thereby, degradation of the display layer 50 can be suppressed.

The thickness of the bonding layer 60 is, for example, not less than 500 nm and not more than 50 μm. The water and oxygen included in the bonding layer 60 are reduced by the thickness of the bonding layer 60 being set to be within this range. Also, the penetration of moisture and/or oxygen from the bonding layer 60 can be suppressed.

The bonding layer 60 may include, for example, a moisture adsorbent or a desiccant. Thereby, the reliability of the bonding layer 60 increases.

The support body 70 includes, for example, at least one selected from a silicon nitride film ($SiN_x$), a silicon oxynitride film ($SiO_xN_y$), a silicon oxide film ($SiO_x$), and an aluminum oxide film ($AlO_x$). It is favorable for the support body 70 to have high barrier properties for moisture and oxygen. The support body 70 may be, for example, flexible. For example, a film is used as the support body 70. The thickness of the film is, for example, not less than 10 μm and not more than 250 μm. It is desirable for the thickness to be 100 μm or less in applications in which a flexible display is necessary.

The display element 110 includes, for example, the resin layer 20 having the first water permeability, the barrier layer 31 that is provided on the resin layer 20 and has the second water permeability that is lower than the first water permeability, and the display layer 50 that is provided on the barrier layer 31. Also included are a circuit substrate 220 that is separated from the display layer 50 in a second direction that intersects a first direction from the resin layer 20 toward the display layer 50, the first protective layer 32 that is provided on the circuit substrate 220 and has the third water permeability that is lower than the first water permeability, and the interconnect layer 40. The interconnect layer 40 includes, for example, a first portion provided between the barrier layer 31 and the display layer 50 and a second portion provided between the circuit substrate 220 and the first protective layer 32. The second portion of the interconnect layer 40 overlaps the resin layer 20 when projected onto a plane perpendicular to the second direction.

The display element 110 has a structure in which, for example, the second portion of the interconnect layer 40 is positioned to be lower (in a direction opposite to the stacking direction) than the first portion. Therefore, the yield during the mounting increases.

FIG. 1C is a schematic cross-sectional view in which a portion a that includes the display region Da is enlarged.

As shown in FIG. 1C, the interconnect layer 40 includes, for example, a thin film transistor 90 (TFT). The thin film transistor 90 includes a gate electrode 91, a gate insulating film 41, a channel layer 92, a channel protection layer 42, a source electrode 93, and a drain electrode 94. The interconnect layer 40 also includes a passivation layer 43, a planarizing layer 44, a pixel electrode 45, and a bank 46.

For example, the gate electrode 91 is formed on the barrier layer 31. At this time, a gate interconnect (not shown) that is connected to the gate electrode 91 also is formed. The gate electrode 91 and the gate interconnect are formed by, for example, forming a metal thin film by sputtering, etc., and by etching a portion of the metal thin film using a resist pattern formed by photolithography, etc., as a mask. The metal thin film includes, for example, one selected from Ti, Ta, Mo, W, Al, Cu, and Ag or an alloy including one selected from these metals. The metal thin film may be a single-layer film or a stacked film.

The gate insulating film 41 is formed on the gate electrode 91 and the barrier layer 31. The gate insulating film 41 is formed by, for example, chemical vapor deposition (CVD), atomic layer deposition (ALD), or sputtering. The gate insulating film 41 includes, for example, at least one selected from a silicon nitride film ($SiN_x$), a silicon oxynitride film ($SiO_xN_y$), a silicon oxide film ($SiO_x$), and an aluminum oxide film ($AlO_x$).

The channel layer 92 is formed on the gate insulating film 41. The channel layer 92 is formed by, for example, forming a channel film on the gate insulating film 41 by sputtering, etc., and by patterning by photolithography, etc.

The channel film that is used to form the channel layer 92 includes, for example, an oxide semiconductor material. The channel film may include, for example, O and at least one of In, Ga and Zn. The channel film may include, for example, at least one of InGaZnO, InSnZnO, InO, InZnO, InGaO, ZnO, ZnON and $Ga_2O_3$. The channel film may include, for example, an organic semiconductor material, polysilicon, or amorphous silicon. The organic semiconductor material may include, for example, pentacene. In the case where the channel layer 92 includes amorphous silicon, for example, an $n^+$ a-Si layer is formed to provide the contact with the source electrode 93 and the drain electrode 94.

For example, the channel protection layer 42 is formed on the channel layer 92 and the gate insulating film 41. The channel protection layer 42 includes, for example, a silicon oxide film ($SiO_x$) and/or an aluminum oxide film ($AlO_x$). To increase the barrier properties, a stacked film including at least two films selected from a silicon nitride film ($SiN_x$), a silicon oxynitride film ($SiO_xN_y$), a silicon oxide film ($SiO_x$), and an aluminum oxide film ($AlO_x$) may be used. For example, the channel protection layer 42 is formed by forming a channel protection film that is used to form the channel protection layer 42 by sputtering, etc., and by making contact holes in the channel protection film. Simultaneously, a contact hole to the gate interconnect may be made in the channel protection film. The channel protection layer 42 may be formed by patterning by a self-aligning method using back exposure. Thereby, the patterning precision increases; and, for example, a fine thin film transistor 90 can be obtained.

A back-channel cut thin film transistor 90, in which the channel protection layer 42 is not used, may be used. In the case where the channel layer 92 includes an oxide semiconductor material, the characteristics of the back channel interface greatly affect the TFT characteristics. Therefore, it is desirable to use the channel protection layer 42 in such a case.

For example, the source electrode 93, the drain electrode 94, a source contact 95, and a drain contact 96 are formed simultaneously. For example, a metal thin film is formed on the channel protection layer 42 and inside the contact holes. The source electrode 93 and the drain electrode 94 are formed by patterning the metal thin film by photolithography, etc. The metal thin film may be formed after forming a mask beforehand; and the mask may be removed.

The source electrode 93, the drain electrode 94, the source contact 95, and the drain contact 96 may be formed separately from each other.

The metal thin film includes, for example, at least one selected from Ti, Ta, Mo, W, Al, Cu, and Ag or an alloy including one selected from these metals. The metal thin film may be a single-layer film or a stacked film.

Thereby, the thin film transistor 90 is formed. Although an example of the thin film transistor 90 having a bottom-gate structure is described above, the thin film transistor 90 having another structure may be used.

The passivation layer 43 is formed on the source electrode 93, the drain electrode 94, and the channel protection layer 42. The passivation layer 43 includes, for example, at least one inorganic material selected from a silicon nitride film ($SiN_x$), a silicon oxynitride film ($SiO_xN_y$), a silicon oxide film ($SiO_x$), and an aluminum oxide film ($AlO_x$). The passivation layer 43 may include a resin material. For example, acrylic, epoxy, polyimide, or a paraxylene resin is used as the resin material.

In the example, the planarizing layer 44 is formed on the passivation layer 43. The planarizing layer 44 includes, for example, a resin material. The resin material includes, for example, acrylic, epoxy, polyimide, a paraxylene resin, etc.

The planarizing layer 44 may include a colored layer. For example, a colored layer may be formed as the planarizing layer 44. A colored layer may be stacked with a film used to form a portion of the planarizing layer 44. The colored layer may be formed by, for example, photolithography, etc.

The colored layer functions as, for example, a color filter. A colored layer of a different color may be provided for each pixel.

The colored layer also functions as a light-shielding layer (light attenuating layer). By providing the light-shielding layer, characteristic fluctuation (e.g., light leakage, etc.) of the thin film transistor 90 is suppressed. In the case where the light emitted from the display layer 50 is white, a layer having, for example, a low transmittance to a wavelength of about 400 nm may be used as the colored layer. In the case where colored light (red, green, blue, etc.) is emitted from the display layer 50, it is favorable for the colored layer to have the same color as the colored light emitted from the display layer 50. A colored layer that is light-shielding (that attenuates light, e.g., a black layer) may be provided at a position opposing the thin film transistor 90.

A contact hole is made by removing a portion of the passivation layer 43 and a portion of the planarizing layer 44 to expose the drain electrode 94. For example, the pixel electrode 45 (the first electrode) is formed inside the contact hole and on the planarizing layer 44. The pixel electrode 45 includes, for example, a conductive film that is transparent (e.g., indium tin oxide (ITO) or indium zinc oxide (IZO)). Surface treatment such as oxygen plasma processing, UV ozone cleaning, etc., of the surface of the pixel electrode 45 may be performed. Thereby, for example, the injection efficiency of holes can be increased.

For example, in the case where the light that is emitted from the display layer 50 is emitted from the support body 70 side, a reflective layer of Al and/or Ag may be formed on the planarizing layer 44; and an ITO film may be formed on the reflective layer.

In the example, the bank 46 is formed to prevent shorts at the pixel electrode 45 end portion. The bank 46 covers the end portion of the pixel electrode 45 on a portion of the planarizing layer 44. The bank 46 includes, for example, a resin such as polyimide, acrylic, etc. The bank 46 may include, for example, an inorganic material such as a silicon oxide film ($SiO_x$), a silicon nitride film ($SiN_x$), etc.

As shown in FIG. 1C, the display layer 50 includes a hole injection layer 51, a hole transport layer 52, an organic light emitting layer 53, an electron transport layer 54, an electron injection layer 55, and a cathode 56 (a second electrode). The display layer 50 is formed on the pixel electrode 45 and the bank 46 by, for example, vacuum vapor deposition. At this time, the hole injection layer 51, the hole transport layer 52, the organic light emitting layer 53, the electron transport layer 54, the electron injection layer 55, and the cathode 56 are formed in this order. The display layer 50 corresponds to, for example, a light emitting unit of an organic electroluminescent element (an OLED).

In the case where an organic light emitting layer 53 that emits white light is used, a color display is obtained by using a colored layer as a portion (e.g., the planarizing layer 44) of the interconnect layer 40. For example, the organic light emitting layer 53 may be formed to emit light of different colors for each of red, green, and blue pixels. In such a case, the organic light emitting layer 53 having different colors may be formed by, for example, a mask (a metal mask).

By switching the thin film transistor 90 to the on-state and applying voltages to the source electrode 93 and the cathode 56, a current is supplied to the organic light emitting layer 53; and light is emitted from the organic light emitting layer 53. The light that is emitted from the organic light emitting layer 53 is emitted from the display element 110 through, for example, the pixel electrode 45, the planarizing layer 44, the passivation layer 43, the gate insulating film 41, the barrier layer 31, and the resin layer 20 that are light-transmissive. In other words, in the example, the lower surface (the surface on the resin layer 20 side) is used as the light emitting surface.

An example of a method for manufacturing the display element 110 will now be described.

FIG. 2A to FIG. 2D, FIG. 3A to FIG. 3D, and FIG. 4A to FIG. 4D are schematic cross-sectional views in order of the processes, showing the method for manufacturing the display element according to the first embodiment.

FIG. 5A, FIG. 5B, FIG. 6A, and FIG. 6B are schematic plan views in order of the processes, showing the method for manufacturing the display element according to the first embodiment.

Figure 2A:
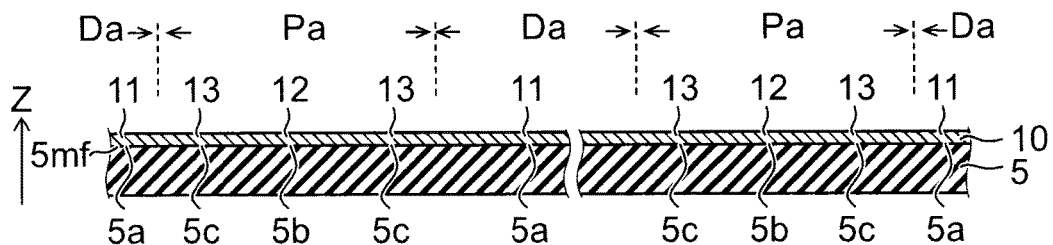
FIG. 2A to FIG. 2D are schematic cross-sectional views in order of the processes, showing a method for manufacturing the display element according to the first embodiment.
Figure 2B:
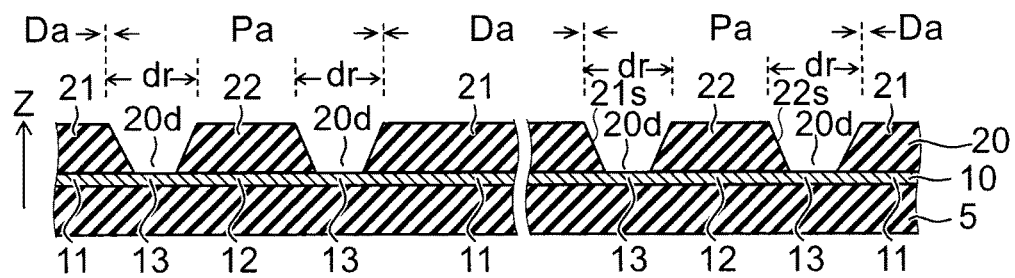
Figure 4A:
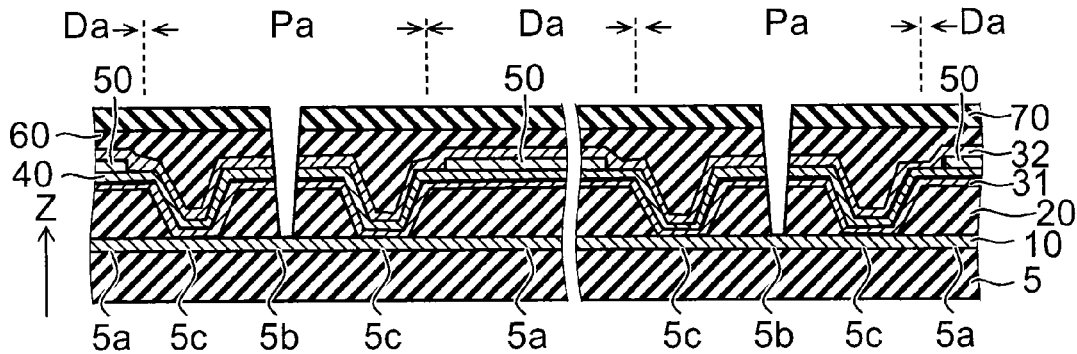
FIG. 4A to FIG. 4D are schematic cross-sectional views in order of the processes, showing a method for manufacturing the display element according to the first embodiment.
Figure 5A:
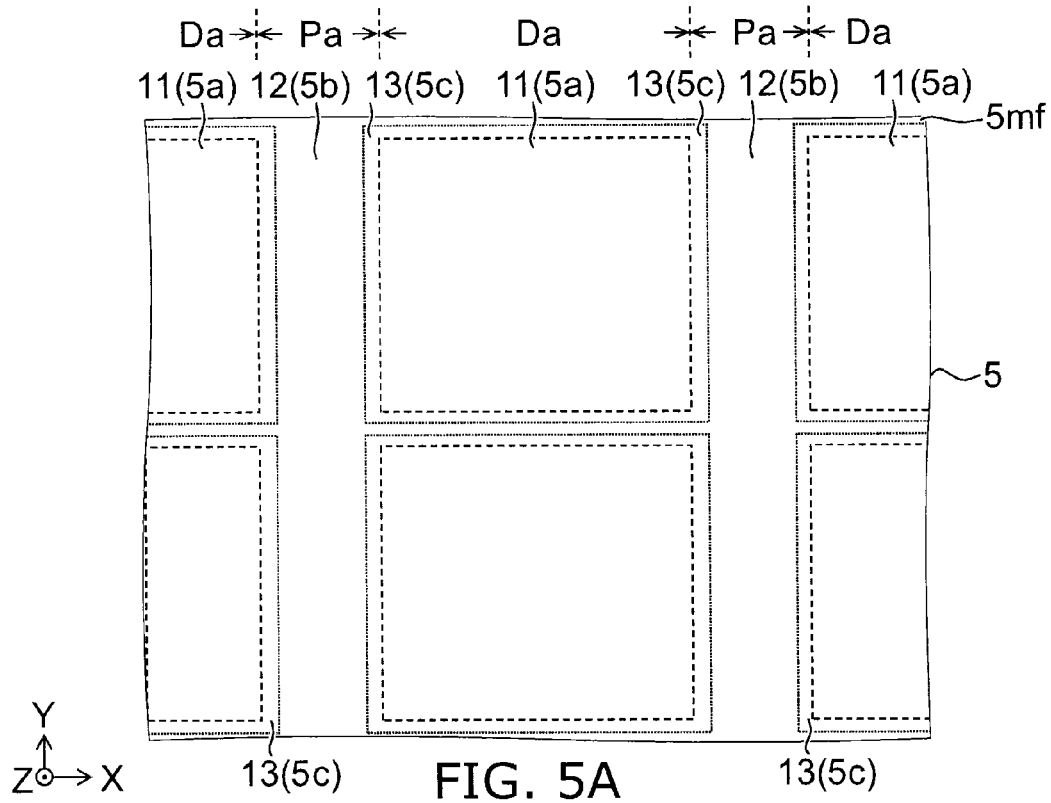
FIG. 5A and FIG. 5B are schematic plan views in order of the processes, showing the method for manufacturing the display element according to the first embodiment.
Figure 5B:
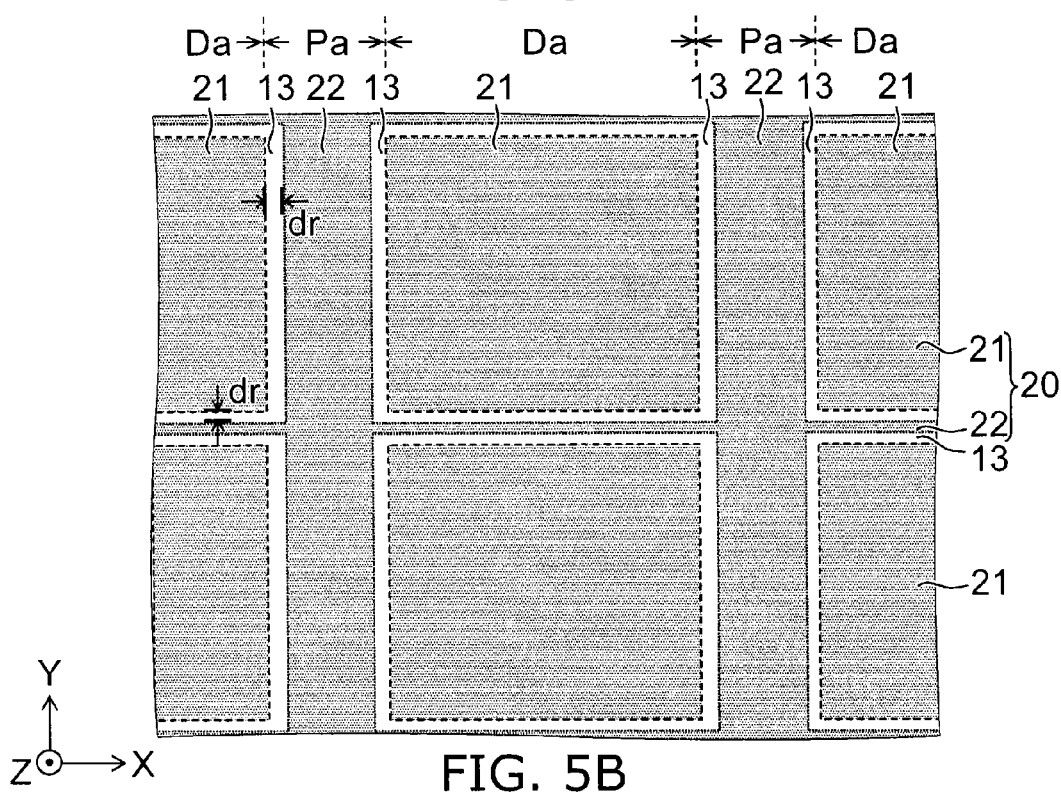
Figure 6A:
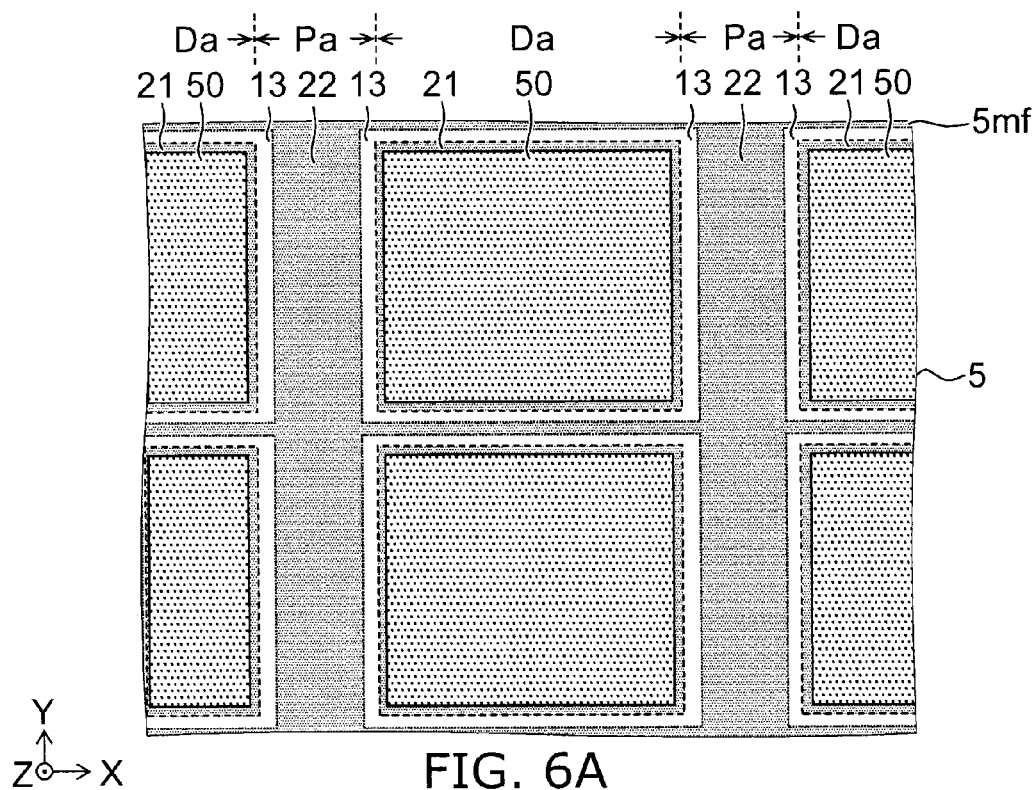
FIG. 6A and FIG. 6B are schematic plan views in order of the processes, showing the method for manufacturing the display element according to the first embodiment.
Figure 6B:
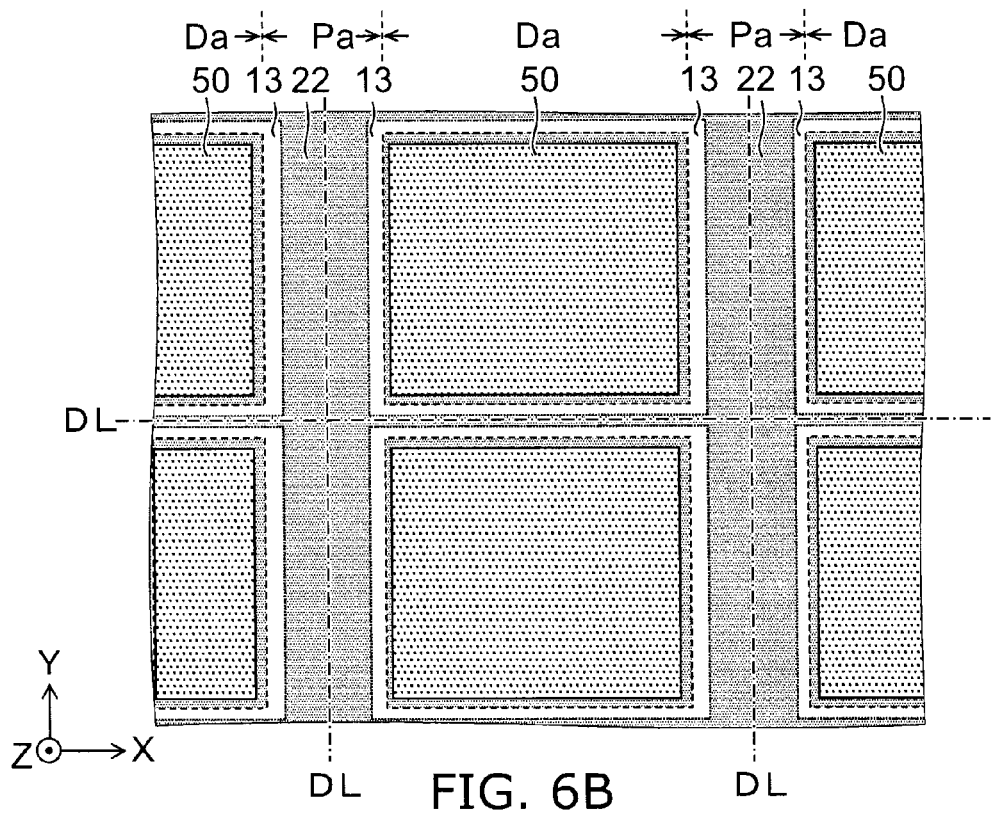

FIG. 5A is a plan view of FIG. 2A. FIG. 5B is a plan view of FIG. 2B. FIG. 6A is a plan view of FIG. 3A. FIG. 6B is a plan view of FIG. 4A.

As shown in FIG. 2A and FIG. 5A, a peeling layer 10 is formed on a major surface 5mf of a base body 5. The base body 5 includes, for example, glass. For example, glass that has excellent heat resistance and little metal contamination may be used. For example, alkali-free glass is used.

As shown in FIG. 5A, the major surface 5mf of the base body 5 has a first region 5a, a second region 5b, and a third region 5c. In the example, the major surface 5mf multiply includes each of the first to third regions 5a to 5c. The second region 5b is provided around the first region 5a. The third region 5c is provided between the first region 5a and the second region 5b. The first region 5a corresponds to the display region Da of the display element 110. The second region 5b and the third region 5c correspond to the peripheral region Pa of the display element 110.

In the example as shown in FIG. 2A, the peeling layer 10 includes multiple first peeling portions 11, multiple second peeling portions 12, and multiple third peeling portions 13. The first peeling portion 11 is provided on the first region 5a. The second peeling portion 12 is provided on the second region 5b. The third peeling portion 13 is provided on the third region 5c. As shown in FIG. 5A, the third peeling portion 13 is disposed between the first peeling portion 11 and the second peeling portion 12 when projected onto the plane perpendicular to the stacking direction.

The peeling layer 10 has a first linear coefficient of thermal expansion. The first linear coefficient of thermal expansion is different from the second linear coefficient of thermal expansion of the resin layer 20. The peeling layer 10 includes, for example, a material having a linear coefficient of thermal expansion that is greatly different from that of the resin layer 20. For example, the first linear coefficient of thermal expansion is smaller than the second linear coefficient of thermal expansion. It is favorable for the peeling layer 10 to include, for example, a material that absorbs much light of a wavelength of 1 μm. The peeling layer 10 includes, for example, at least one selected from a metal, a metal oxide, and a metal nitride. The peeling layer 10 includes, for example, Ti. The peeling layer 10 may include, for example, a metal such as Mo, Ta, Al, W, Cu, etc., or an alloy including one selected from these metals.

As shown in FIG. 1B and FIG. 5B, the resin layer 20 is formed on the peeling layer 10. The first resin portion 21 of the resin layer 20 is formed on the first peeling portion 11. The second resin portion 22 of the resin layer 20 is formed on the second peeling portion 12. In the example, the first resin portion 21 and the second resin portion 22 are multiply formed.

For example, a resin film that is used to form the resin layer 20 may be formed on the first peeling portion 11, the second peeling portion 12, and the third peeling portion 13. A trench 20d (a recess) is made in the resin film by removing the resin film that is on the third peeling portion 13. Thereby, the first resin portion 21 and the second resin portion 22 are formed. The resin layer 20 may be selectively formed, for example, on the first peeling portion 11 and the second peeling portion 12.

For example, printing is used to form the resin layer 20 (the resin film). For example, screen printing, offset printing, inkjet printing, etc., may be used for the printing. Photolithography may be used to form the resin layer 20. For example, patterning by a developing process using a photosensitive resin may be used. For example, patterning by etching using a photoresist may be used.

The thickness of the resin layer 20 (the resin film) is, for example, not less than 1 μm and not more than 30 μm. For example, the removing (peeling) of the peeling layer 10 becomes easier by setting the thickness of the resin layer 20 to be 5 μm or more. By setting the thickness of the resin layer 20 to be 20 μm or less, the degradation of optical characteristics such as birefringence, absorption, etc., and the decrease of dimensional stability due to moisture absorption, etc., can be suppressed even in the case where, for example, the light is emitted to the outside from the resin layer 20. The resin film may be formed to have a thickness that is greater than 5 μm; and the thickness of the resin film (the resin layer 20) may be patterned to be 20 μm or less after removing (peeling) the base body 5.

As shown in FIG. 5B, the third peeling portion 13 is disposed around the first resin portion 21. The second resin portion 22 is disposed around the third peeling portion 13. For example, the third peeling portion 13 is exposed from the trench 20d (the recess) of the resin layer 20.

A distance dr between the first resin portion 21 and the second resin portion 22 when projected onto the plane perpendicular to the stacking direction is, for example, not less than 1 μm and not more than 100 μm. The distance dr corresponds to the width (the length in a direction perpendicular to the stacking direction) of the trench 20d (the recess). For example, the moisture barrier effect of the barrier layer 31 between the first resin portion 21 and the second resin portion 22 (inside the trench 20d) is sufficiently realized in subsequent processes by setting the distance dr to be 1 μm or more. As described below, the peeling of the peeling layer 10 is easier by setting the distance dr to be 100 μm or less.

Figure 2C:
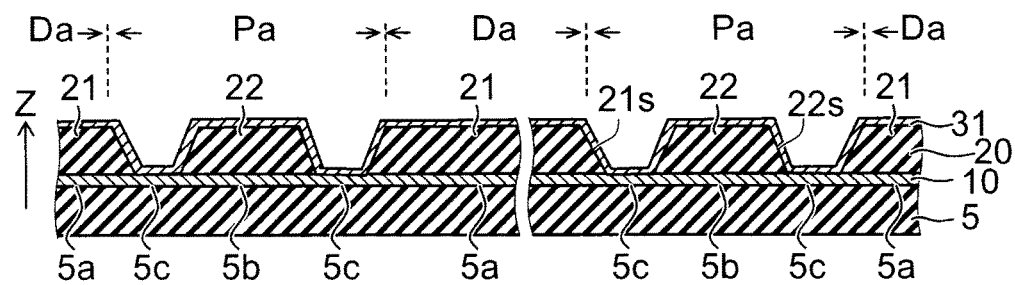

As shown in FIG. 2C, a barrier film that is used to form the barrier layer 31 is formed on the first resin portion 21, the second resin portion 22, and the third peeling portion 13. The barrier layer 31 also is formed on the first side surface 21s of the first resin portion 21. The barrier layer 31 (the barrier film) contacts, for example, the third peeling portion.

There are cases where a slight amount of the organic substance that is used to form the resin layer 20 exists on the third peeling portion 13 in the formation process of the resin layer 20. For example, there are cases where a slight amount of the organic substance exists unintentionally on the third peeling portion 13 in the printing process. Or, there are cases where residue (organic substances) of the material used to form the resin layer 20 remains on the third peeling portion 13 in the etching process. The state in which organic substances such as residue, etc., exist on the third peeling portion 13 also is included in the state in which the barrier layer 31 contacts the third peeling portion 13. There are cases where the organic substances such as the residue, etc., are not observed when observing by, for example, an electron microscope. There are cases where the organic substances are detected by elemental analysis, etc.

Figure 2D:
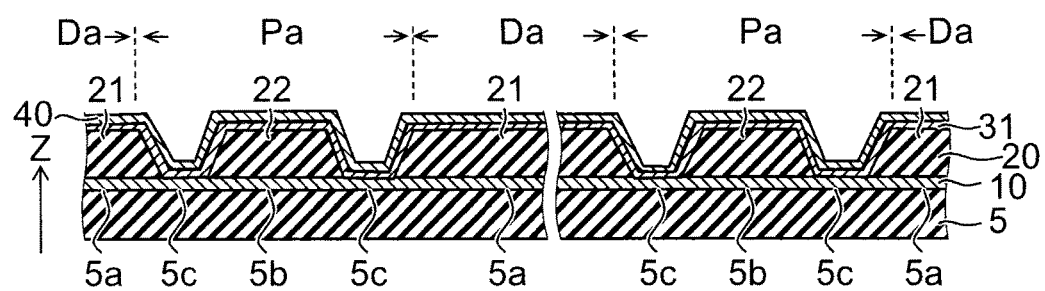

As shown in FIG. 2D, an interconnect film that is used to form the interconnect layer 40 is formed on the barrier film.

Figure 3A:
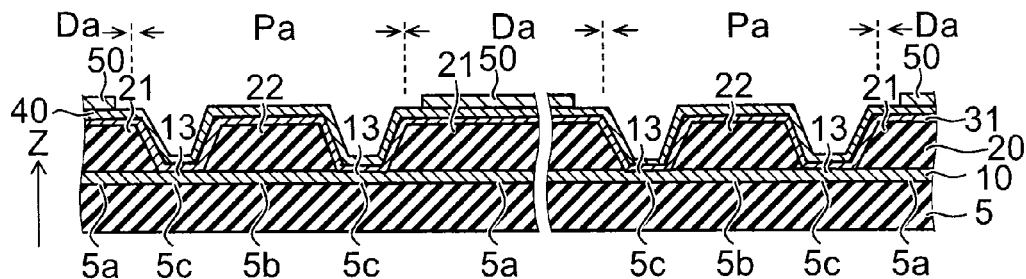
FIG. 3A to FIG. 3D are schematic cross-sectional views in order of the processes, showing a method for manufacturing the display element according to the first embodiment.

As shown in FIG. 3A and FIG. 6A, the display layer 50 is formed on a portion of the interconnect film. As shown in FIG. 6A, the display layer 50 overlaps the display region Da when projected onto the plane perpendicular to the stacking direction.

The barrier film (the barrier layer 31) and the interconnect film (the interconnect layer 40) are not shown in FIG. 6A. For example, the outer edge of the first resin portion 21 is positioned on an outer side of the outer edge of the display layer 50. Thereby, the sealability of the display layer 50 increases.

Figure 3B:
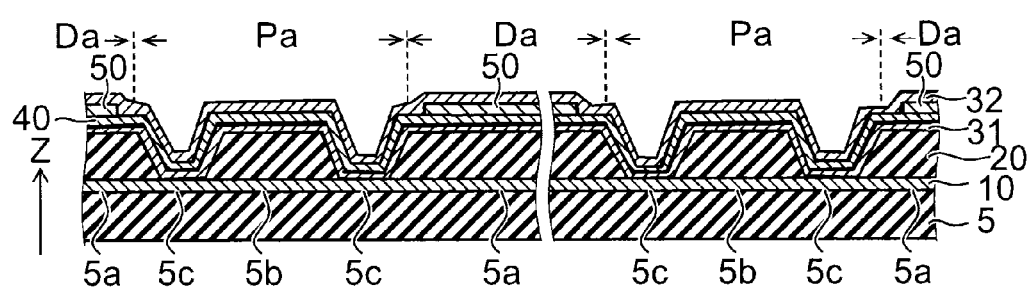

As shown in FIG. 3B, a first protective film that is used to form the first protective layer 32 is formed on the display layer 50 and on the interconnect film (the interconnect layer 40). For example, CVD or ALD is used to form the first protective film. The first protective film is formed at a temperature of, for example, about 100° C. Thereby, for example, the degradation of the display layer 50 can be suppressed. For example, the display layer 50 is sealed with the first protective film.

The first protective film (the first protective layer 32) includes, for example, an inorganic material such as a silicon nitride film ($SiN_x$), an aluminum oxide film ($AlO_x$), etc. A stacked film of an organic film and an inorganic film may be used as the first protective film to improve the sealing performance. For example, acrylic, a paraxylene resin, epoxy, polyimide, etc., may be used as the organic film. By forming the organic layer, it is easier to relax the stress and increase the barrier properties of the inorganic film; defects due to dirt can be suppressed by the planarizing effect; and the penetration of water and oxygen due to pinholes of the inorganic film can be suppressed.

The thickness of the first protective film (the first protective layer 32) is, for example, not less than 1 μm and not more than 30 µm. In the case where the thickness of the first protective film is not less than 1 µm, for example, sufficient sealing performance can be ensured even in the case where there is mixing of foreign material, etc.

Figure 3C:
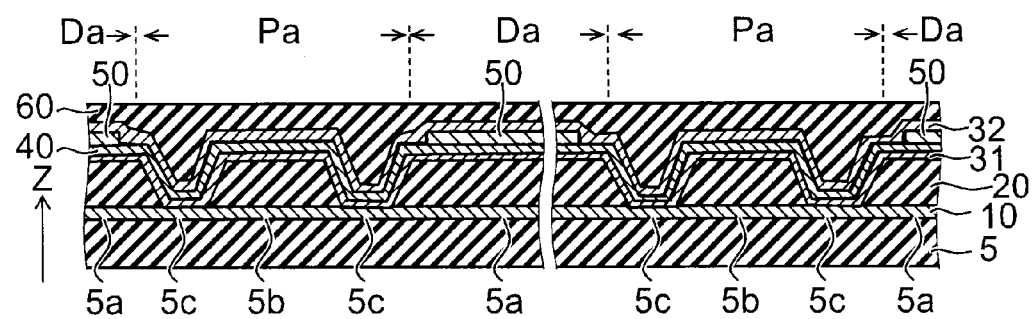
Figure 3D:
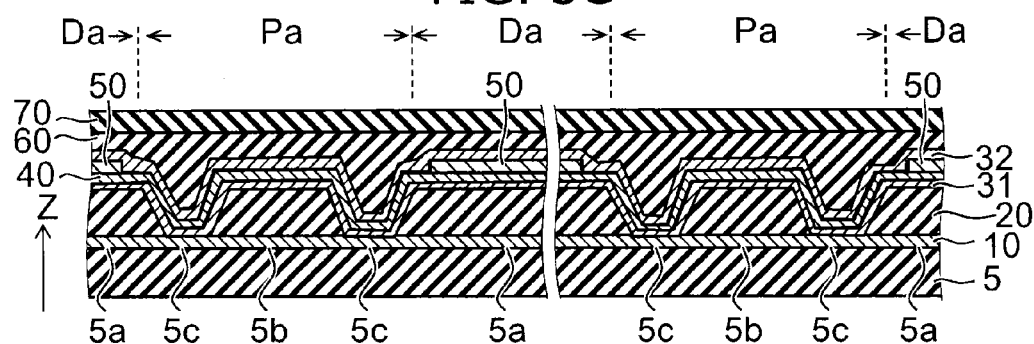

As shown in FIG. 3C and FIG. 3D, a bonding film that is used to form the bonding layer 60 is formed on the first protective film. The support body 70 is formed on the bonding film.

In the example, the bonding film and the support body 70 are formed over the entire surface of the first protective film. For example, the bonding film and the support body 70 may be formed in regions other than the mounting region described below (a portion of the second region 5b of the base body 5 on the first protective layer 32).

FIG. 4A and FIG. 6B show a process of singulating the multiple display elements 110 on the base body 5. The barrier film (the barrier layer 31), the interconnect film (the interconnect layer 40), the first protective film (the first protective layer 32), the bonding film (the bonding layer 60), and the support body 70 are not shown in FIG. 6B.

As shown in FIG. 4A, the second resin portion 22, the barrier film (the barrier layer 31), the interconnect film (the interconnect layer 40), the first protective film (the first protective layer 32), the bonding film (the bonding layer 60), and the support body 70 are divided at a position that corresponds to the second region 5b of the base body 5. The dividing precision is increased by dividing on the base body 5.

In FIG. 6B, the second resin portion 22, etc., are divided along a dividing line DL.

In the dividing, for example, light (a first light) is irradiated. For example, a short pulse laser is used. By using the short pulse laser, the occurrence of excessive heat is suppressed. Thereby, for example, the precision of the dividing increases; and the reproducibility improves. For example, a picosecond laser or a femtosecond laser may be used. An ultraviolet laser may be used.

For example, mechanical cutting using a dicing saw, etc., may be used.

Figure 4B:
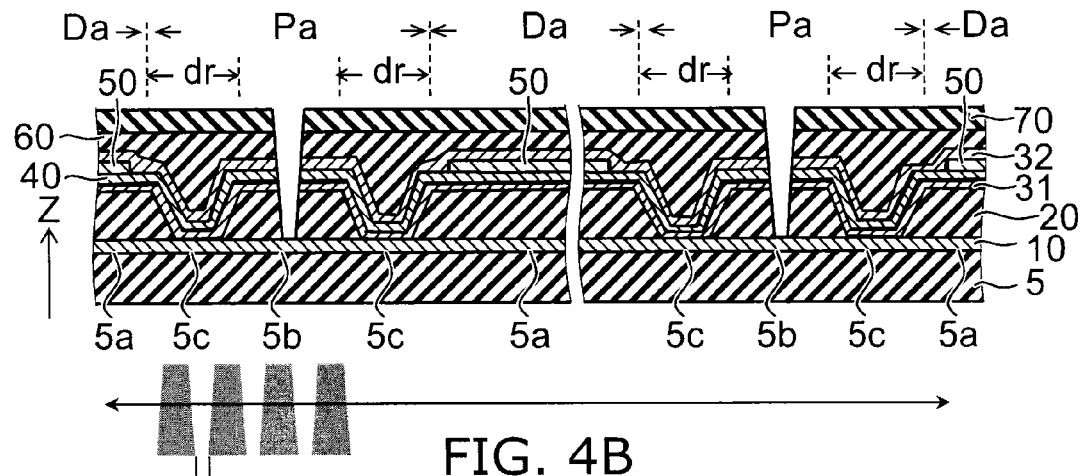

FIG. 4B shows the peeling process of the base body 5.

In the example as shown in FIG. 4B, light (a second light) such as, for example, a laser, etc., is irradiated through the base body 5 onto the peeling layer 10. The peeling layer 10 is heated by the light irradiation; and, for example, stress occurs due to the difference between coefficients of thermal expansion. The peeling layer 10 is removed (peeled) from the resin layer 20 due to the stress. The peeling layer 10 remains, for example, on the base body 5. There are cases where a portion is vaporized by the heating.

It is favorable for the light source of the second light to include, for example, a laser that can stably produce a high output. For example, a beam having a line configuration may be irradiated by a solid-state laser such as a YAG laser, etc.

In the case where an infrared laser is used for the peeling, a beam having a line configuration may be irradiated intermittently at a prescribed irradiation spacing dx. The irradiation spacing dx is, for example, not more than 100 µm. By setting the irradiation spacing dx to be 100 µm or less, the regions that are not irradiated with the laser also are peeled simultaneously. Continuous irradiation may be combined with intermittent irradiation.

In the example, the resin layer 20 is not formed on the third region 5c of the base body 5. In other words, the third peeling portion 13 contacts the barrier layer 31 (the barrier film) between the first resin portion 21 and the second resin portion 22 when projected onto the plane perpendicular to the stacking direction. By setting the distance dr between the first resin portion 21 and the second resin portion 22 to be 100 µm or less, the peeling layer 10 can be peeled even at portions where the resin layer 20 is not formed.

For example, a lamp may be used as the light source of the second light. Microwaves may be used in the peeling process. Moreover, the peeling layer 10 may be mechanically peeled without using electromagnetic waves, etc.

Figure 4C:
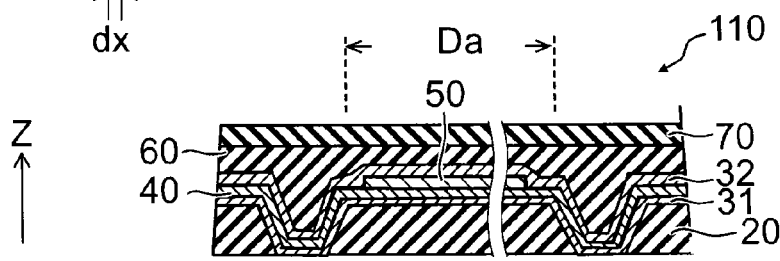

As shown in FIG. 4C, the display element 110 is singulated by the base body 5 being peeled. The barrier film is used to form the barrier layer 31. The interconnect film is used to form the interconnect layer 40. The first protective film is used to form the first protective layer 32. The bonding film is used to form the bonding layer 60. Thereby, the display element 110 is formed.

Figure 4D:
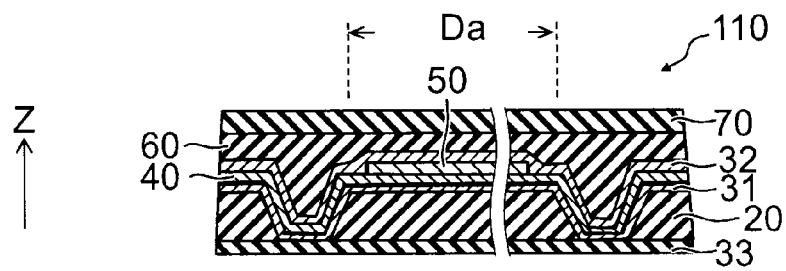

As shown in FIG. 4D, a second protective layer 33 may be formed, for example, on the surface of the resin layer 20 that is exposed by the peeling layer 10 being removed. For example, the penetration of moisture and/or oxygen is prevented by the second protective layer 33. The second protective layer 33 includes, for example, an inorganic material such as a silicon nitride film ($SiN_x$), an aluminum oxide film ($AlO_x$), etc. The second protective layer 33 may include a stacked film of an inorganic film and an organic film.

It is favorable to perform the process of peeling the peeling layer 10 from the resin layer 20 and the process of forming the second protective layer 33 in a dry atmosphere or at reduced pressure (e.g., in a vacuum). Thereby, the penetration of moisture, etc., can be suppressed.

An example in which multiple display elements are formed on the base body 5 is described above. The manufacturing method recited above is applicable even in the case where one display element is formed on the base body 5. In such a case, the process of dividing may be omitted.

In the method for manufacturing the display element 110, a region where the resin layer 20 is not formed between the first resin portion 21 and the second resin portion 22 when projected onto the plane perpendicular to the stacking direction is provided. For example, the trench 20d (the recess) is made in the resin layer 20 by removing the resin film of the resin layer 20 between the first resin portion 21 and the second resin portion 22. The first side surface 21s of the first resin portion 21 is covered with the barrier layer 31 because the barrier layer 31 is formed inside the trench 20d as well. Thereby, the penetration of moisture and/or oxygen from the side surface (the first side surface 21s) of the resin layer 20 into the display layer 50 can be suppressed. The display layer 50 can be sealed sufficiently without drastically increasing the number of processes. Thereby, a display element having high reliability can be manufactured.

In the method for manufacturing the display element 110, the dividing of the resin layer 20, the barrier layer 31 (the barrier film), the interconnect layer 40 (the interconnect film), and the first protective layer 32 (the first protective film) is implemented on the base body 5. Therefore, high-precision dividing is possible. Thereby, a narrow border is possible. Further, the yield increases. In the method, the base body 5 is not divided because the peeling layer 10 exists. Therefore, the base body 5 can be re-utilized after being removed; and the cost can be reduced. Also, in the manufacturing method, a display element 110 having high reliability can be obtained because there are no processes in which the display element 110 is subjected to a load.

Second Embodiment

The embodiment relates to a display device including the display element described in regard to the first embodiment and a method for manufacturing the display device.

FIG. 7A to FIG. 7C are schematic cross-sectional views in order of the processes, showing the display device and the method for manufacturing the display device according to the second embodiment.

An example of a method for manufacturing the display device 200 according to the embodiment will now be described. In the manufacturing method described below, for example, the method described in regard to FIG. 2A to FIG. 2D, FIG. 3A to FIG. 3D, and FIG. 4A to FIG. 4D is applicable to the formation process of the display element 110.

In the display element 110 as shown in FIG. 7A, the barrier layer 31 that is exposed by the removal of the base body 5 is removed. Thereby, the interconnect layer 40 is exposed. For example, a dry etching process such as RIE using $CH_4$, $O_2$, etc., may be used to remove the barrier layer 31.

For example, a connection pad may be formed on the third region 5c of the base body 5 when forming the gate electrode 91 in the formation of the interconnect layer 40. The connection pad may include, for example, the same material as the gate electrode 91. For example, the connection pad of the interconnect layer 40 is exposed by the barrier layer 31 being removed. In the case where the connection pad is not formed beforehand, the connection pad may be formed, for example, after removing the barrier layer 31.

A portion of the first resin portion 21 and the entirety or a portion of the second resin portion 22 may be removed when removing the barrier layer 31. By removing a portion of the resin layer 20, the degradation of the optical characteristics due to birefringence, absorption, etc., can be prevented. Also, by the resin layer 20 being thinner by removing a portion of the resin layer 20, the decrease of dimensional stability due to moisture absorption, etc., can be suppressed. It is favorable for the thickness of the resin layer 20 to be, for example, 3 μm or less. When an optical layer such as a circular polarizing plate, etc., is attached to the surface in the case of a bottom-emission structure, the reflections of the light that is obliquely incident can be reduced sufficiently by setting a film thickness d (μm) and a birefringence x (nm) in the perpendicular direction of the resin layer 20 to be such that d×x is not more than 2000.

As shown in FIG. 7B, the connection pad is electrically connected to the circuit substrate 220 via a connection member 210. The connection member 210 includes, for example, an anisotropic conductive film (ACF). The circuit substrate 220 includes, for example, a flexible printed circuit board (FPC). The circuit substrate 220 is connected to, for example, a drive unit 230. The input (and output) of signals from the outside is possible by the drive unit 230, etc. Thereby, the display device 200 is formed. It is favorable for the size of the connection pad to be, for example, not more than 100 μm. Thereby, the yield of the peeling from the base body 5 can be increased.

In the display device 200, the drive unit 230 is mounted to a surface from which the base body 5 is removed. Therefore, the bonding process of the support body 70 is simpler than in the case where the drive unit 230 is mounted to a surface from which the support body 70 is removed. Also, the degrees of freedom of design increase because the drive unit 230 is mounted to the surface from which the base body 5 is removed.

In the display device 200 as shown in FIG. 7C, an optical layer 240 may be provided at a position opposing the display layer 50 in the case where the light is emitted to the outside from the resin layer 20 side. The optical layer 240 includes, for example, a circular polarizing plate. Thereby, the reflection of external light can be suppressed. In the example, the optical layer 240 is provided to cover the circuit substrate 220. Peeling of the circuit substrate 220 can be suppressed by the optical layer 240. The reliability of the panel is increased by using a component having high barrier properties for water and oxygen as the optical layer 240. Further, the reliability of the panel increases even in the case where the barrier layer 31 is formed after mounting the connection member 210.

FIG. 8A and FIG. 8B are schematic cross-sectional views in order of the processes, showing another display device and a method for manufacturing the display device according to the second embodiment.

In the method for manufacturing the display device 201 described below as well, for example, the method described in regard to FIG. 2A to FIG. 2D, FIG. 3A to FIG. 3D, and FIG. 4A to FIG. 4D may be appropriately applied to the formation process of the display element 110.

As shown in FIG. 8A, for example, the bonding layer 60 (the bonding film) and the support body 70 are formed in regions other than the second region 5b in the formation process of the display element 110. For example, at least a portion of the first protective layer 32 (the first protective film) that is provided on the second region 5b is removed to expose the interconnect layer 40 (the interconnect film). For example, a dry etching process such as RIE using $CH_4$, $O_2$, etc., may be used to remove the first protective layer 32. Also, the first protective layer 32 may be formed after performing masking beforehand.

The removal of the first protective layer 32 may be performed prior to or after the formation of the bonding layer 60 and the support body 70. Or, the bonding layer 60 and the support body 70 may be formed in the regions other than the second region 5b when forming the first protective layer 32. The bonding layer 60 and the support body 70 may be formed on the second region 5b; and, for example, the bonding layer 60 and the support body 70 that are on the second region 5b may be removed when the first protective layer 32 is removed.

As shown in FIG. 8B, the interconnect layer 40 that is exposed is connected to the circuit substrate 220 via the connection member 210. The circuit substrate 220 is connected to, for example, the drive unit 230.

The base body 5 is removed. Thereby, the display device 201 is formed.

In the example, the bonding layer 60 (the bonding film) and the support body 70 are formed; and a portion of the bonding layer 60, a portion of the support body 70, and a portion of the first protective layer 32 are removed after dividing the resin layer 20, etc.

The embodiment is not limited thereto. For example, the first protective layer 32 (the first protective film) that is formed on the second region 5b may be removed prior to forming the bonding layer 60 (the bonding film) and the support body 70; and the bonding layer 60 (the bonding film) and the support body 70 may be formed on the first region 5a and the third region 5c.

Further, the dividing of the resin layer 20, etc., may be implemented prior to or after removing the first protective layer 32.

In the example, the base body 5 is removed after mounting the drive unit 230. The embodiment is not limited thereto. For example, the drive unit 230 may be mounted after removing the base body 5.

FIG. 9A to FIG. 9D are schematic cross-sectional views in order of the processes, showing another display device and a method for manufacturing the display device according to the second embodiment.

In the method for manufacturing the display device 202 described below, for example, the method described in regard to FIG. 2A to FIG. 2D, FIG. 3A to FIG. 3D, and FIG. 4A to FIG. 4D may be appropriately applied to the formation process of the display element 110.

Figure 9A:
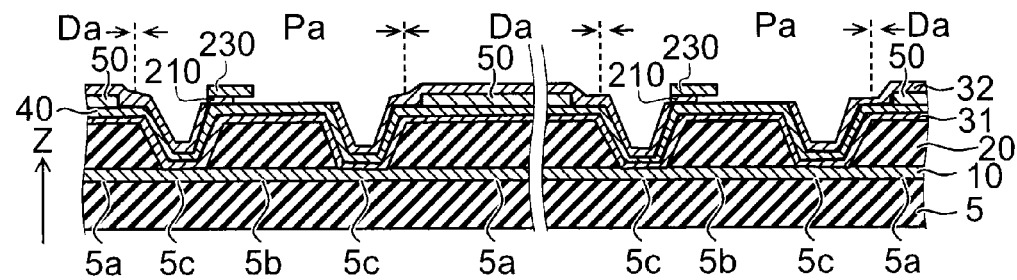
FIG. 9A to FIG. 9D are schematic cross-sectional views in order of the processes, showing another display device and a method for manufacturing the display device according to the second embodiment.

In the formation process of the display element 110 as shown in FIG. 9A, for example, the drive unit 230 is formed directly on the first protective layer 32 on the second region 5b with the connection member 210 interposed after forming the first protective layer 32 (the first protective film). The drive unit 230 may include, for example, a thin driver IC. The thickness of the driver IC is, for example, not more than 100 µm. By the thickness being set to be 100 µm or less, the display device does not crack easily even when the display device deforms.

Figure 9B:
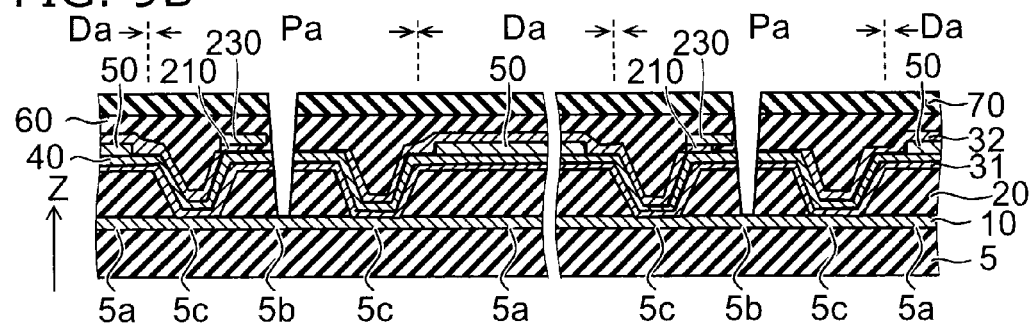

As shown in FIG. 9B, the bonding layer 60 (the bonding film) and the support body 70 are formed on the first protective layer 32 (the first protective film) and the drive unit 230. The support body 70, the bonding layer 60 (the bonding film), the interconnect layer 40 (the interconnect film), the barrier layer 31 (the barrier film), and the second resin portion 22 are divided.

Figure 9C:
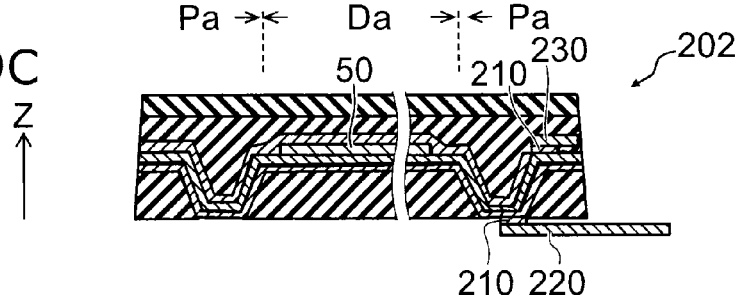
Figure 9D:
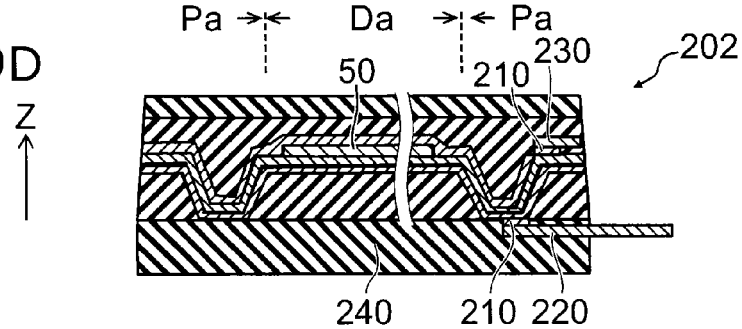

As shown in FIG. 9C, the display device 202 is formed by removing the base body 5 and using the connection member 210 to connect the circuit substrate 220 for the connection to the external circuit. Further, as shown in FIG. 9D, the optical layer 240 may be formed in the display device 202. Because the driver IC is built-in, the number of connection points with the circuit substrate 220 can be reduced; the occurrence of defects of the interconnects such as breakage, etc., is suppressed; and a display device having high reliability can be provided.

By covering the drive unit 230 with the support body 70, the drive unit 230 does not crack easily even in the case where the drive unit 230 is thin. The bonding layer 60 (the bonding film) and the support body 70 may be formed in the regions excluding the drive unit 230.

In the example, the bonding layer 60 (the bonding film) and the support body 70 are formed after a portion of the first protective layer 32 (the first protective film) is removed and the drive unit 230 is mounted.

The embodiment is not limited thereto. For example, the first protective layer 32, the bonding layer 60, and the support body 70 may be formed on the first region 5a, the second region 5b, and the third region 5c of the base body 5; and the first protective layer 32, the bonding layer 60, and the support body 70 that are on the second region 5b may be removed subsequently.

The dividing of the resin layer 20, etc., may be implemented prior to or after mounting the drive unit 230.

FIG. 10A to FIG. 10D are schematic views showing another display device according to the second embodiment.

FIG. 10A is a schematic plan view showing display elements. FIG. 10A is a plan view corresponding to FIG. 6B. FIG. 10B to FIG. 10D show examples of dispositions of the pad electrodes. The display element may include the pad electrodes. Or, the display element may include the pad electrodes.

As shown in FIG. 10A, a pad region 80 is provided in the display element. For example, the display device is formed by the display element being connected to the external circuit in the pad region 80.

The pad region 80 is provided, for example, on the second region 5b (referring to FIG. 8B), that is, on the second resin portion 22. The pad region 80 may be provided at a position corresponding to the third region 5c (referring to FIG. 7B).

For example, a pad electrode 81 and a pad interconnect 82 are provided in the pad region 80. FIG. 10B to FIG. 10D show examples of dispositions of the pad electrode 81 and the pad interconnect 82 in the pad region 80.

As shown in FIG. 10B, multiple pad electrodes 81 and multiple pad interconnects 82 are provided in the pad region 80. The pad interconnects 82 are connected respectively to the pad electrodes 81. In the example, multiple pad electrodes 81 are arranged at one position along the direction from the pad electrode 81 toward the pad interconnect 82.

In the example as shown in FIG. 10C, the multiple pad electrodes 81 are disposed at two positions along the direction from the pad electrode 81 toward the pad interconnect 82.

As shown in FIG. 10D, a pad trench 83 may be provided in the pad region 80; and the pad electrodes 81 may be disposed in the pad trench 83. For example, the width of the pad trench 83 may be the same as or different from the width of the pad electrodes 81. In the example, the width of the pad trench 83 is the same as the width of the pad electrodes 81. Further, the configuration of the pad electrodes 81 may be the same as or different from the configuration of the pad trench 83. In the example, multiple (three) pad electrodes 81 are provided in one pad trench 83. For example, a different pad trench 83 may be provided for each of the pad electrodes 81.

Third Embodiment

The embodiment relates to the display element 120. Other than the display layer 50, for example, the configuration described in regard to FIG. 1A is applicable to the configuration of the display element 120 described below. The display layer 50 of the display element 120 will now be described.

Figure 11:
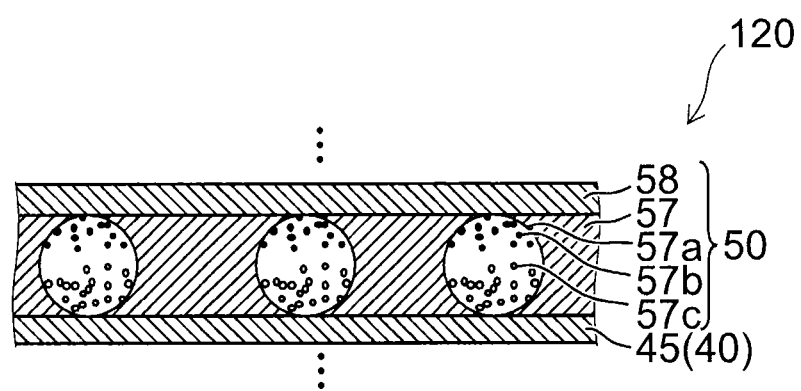
FIG. 11 is a schematic cross-sectional view showing a display element according to a third embodiment.

FIG. 11 is a schematic cross-sectional view showing the display element according to the third embodiment.

FIG. 11 shows the display layer 50 of the display element 120.

In the display element 120, the display layer 50 includes, for example, a reflectance control layer 57 and an upper electrode 58. The reflectance control layer 57 includes, for example, a microcapsule 57a. In the example, the microcapsule 57a includes, for example, first particles 57b and second particles 57c. The first particles 57b and the second particles 57c have, for example, charges. For example, the first particle 57b and the second particle 57c have different charges. The first particle 57b and the second particle 57c have different optical reflectances (including wavelength dependence). The reflectance control layer 57 is, for example, an electrophoresis layer. The reflectance control layer 57 may include, for example, a film that is supportive. In such a case, the support body 70 may not be provided on the display layer 50.

The first particles 57b and the second particles 57c move inside the microcapsule 57a due to voltages applied to the upper electrode 58 and the pixel electrode 45. The optical reflectance changes according to the distribution of the first particles 57b and the second particles 57c inside the microcapsule 57a. Thereby, the display is performed.

In the display element 120, the penetration of moisture, oxygen, etc., into the display layer 50 can be suppressed because the first side surface 21s of the first resin portion 21 is covered with the barrier layer 31. In the display element 120 as well, high reliability is obtained.

The methods for manufacturing described in regard to FIG. 7A to FIG. 7C, FIG. 8A, FIG. 8B, FIG. 9A, and FIG. 9B are applicable to the method for manufacturing the display element 120.

According to the manufacturing method according to the embodiment, a display element and a display device having high reliability can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components included in the method for manufacturing the display element, the display element, and the display device such as the base body, the peeling layer, the resin layer, the barrier layer, the interconnect layer, the display layer, the first protective layer, the bonding layer, the support body, the second protective layer, the connection member, the circuit substrate, the drive unit, the optical layer, etc., from known art; and such practice is within the scope of the invention to the extent that similar effects are obtained.

Further, any two or more components of the specific examples may be combined within the extent of technical feasibility and are included in the scope of the invention to the extent that the purport of the invention is included.

Moreover, all methods for manufacturing a display element, display elements, and display devices practicable by an appropriate design modification by one skilled in the art based on the methods for manufacturing the display element, the display elements, and the display devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a display element, comprising:

forming a peeling layer having a first linear coefficient of thermal expansion on a major surface of a base body, the major surface having a first region, a second region provided around the first region, and a third region provided between the first region and the second region, the first region corresponding to a display region of the display element, the peeling layer including a first peeling portion positioned on the first region, a second peeling portion positioned on the second region, and a third peeling portion positioned on the third region;

forming a resin layer having a first water permeability and a second linear coefficient of thermal expansion different from the first linear coefficient of thermal expansion on the peeling layer, the resin layer including a first resin portion positioned on the first peeling portion and a second resin portion positioned on the second peeling portion;

forming a barrier layer having a second water permeability lower than the first water permeability on the first resin portion, the second resin portion, and the third peeling portion;

forming an interconnect layer on the barrier layer;

forming a display layer on at least a portion of the interconnect layer on the first resin portion; and removing the first peeling portion from the first resin portion and removing the second peeling portion from the second resin portion, wherein the forming of the resin layer includes forming a resin film on the first region, on the second region, and on the third region and removing the resin film on the third region, and the barrier layer contacts the third peeling portion.

2. The method according to claim 1, wherein
    the major surface has the first region in a plurality, and
    the method further comprises dividing the second resin portion, the barrier layer, and the interconnect layer by making a trench in the second resin portion, the barrier layer, and the interconnect layer in the second region between the plurality of first regions along a stacking direction from the base body toward the display layer between the forming of the display layer and the removing.

3. The method according to claim 2, wherein the dividing includes making the trench by irradiating a first light onto the second resin portion, the barrier layer, and the interconnect layer.

4. The method according to claim 3, wherein
    the dividing includes making the trench by irradiating a first light onto the second resin portion, the barrier layer, and the interconnect layer,
    the removing of the peeling layer includes irradiating a second light through the base body onto the peeling layer,
    the first light is light emitted from one selected from a picosecond laser, a femtosecond laser, and an ultraviolet laser, and
    the second light is light emitted from one selected from a YAG laser, an infrared laser, and a lamp.

5. The method according to claim 1, wherein the removing of the peeling layer includes irradiating a second light through the base body onto the peeling layer.

6. The method according to claim 1, wherein the peeling layer includes at least one selected from a metal, a metal oxide, and a metal nitride.

7. The method according to claim 1, further comprising exposing a portion of the interconnect layer by removing a portion of the barrier layer exposed by the removing of the first peeling portion and the second peeling portion.

8. The method according to claim 1, wherein
    the interconnect layer includes a first electrode provided on the first region, and the display layer includes a second electrode and an organic light emitting layer provided between the first electrode and the second electrode.

9. The method according to claim 1, wherein the resin layer includes at least one selected from a polyimide resin, acrylic, aramid, epoxy, a cyclic polyolefin, or a liquid crystal polymer, a paraxylene resin, a fluoric resin, polyethersulphone, polyethylene naphthalate, and polyetheretherketone.

10. The method according to claim 1, wherein an oxygen permeability of the barrier layer is lower than an oxygen permeability of the resin layer.

11. The method according to claim 1, wherein the barrier layer includes at least one selected from a silicon nitride film, a silicon oxynitride film, a silicon oxide film and an aluminum oxide film.

12. The method according to claim 1, wherein the barrier layer includes a stacked film of an inorganic film and an organic resin film.

13. The method according to claim 1, wherein the resin layer includes a film of a metal of one selected from Ti, Mo, Ta, Al, W and Cu, and a film of an alloy including the metal.

14. The method according to claim 1, wherein a thickness of the resin layer is not less than 1 micrometer and not more than 30 micrometers.

15. The method according to claim 1, wherein a distance between the first resin portion and the second resin portion when projected onto a plane perpendicular to a stacking direction from the base body toward the display layer is not less than 1 micrometer and not more than 100 micrometers.

* * * * *